United States Patent
Takamine

(10) Patent No.: US 9,762,209 B2
(45) Date of Patent: Sep. 12, 2017

(54) DUPLEXER WITH A SERIES TRAP ELEMENT AND A SPECIFICALLY CONNECTED CAPACITANCE OR ELASTIC WAVE RESONATOR

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 79 days.

(21) Appl. No.: 15/051,823

(22) Filed: Feb. 24, 2016

(65) Prior Publication Data
US 2016/0173061 A1    Jun. 16, 2016

Related U.S. Application Data

(63) Continuation of application No. PCT/JP2014/067179, filed on Jun. 27, 2014.

(30) Foreign Application Priority Data

Sep. 17, 2013  (JP) .................................. 2013-191981

(51) Int. Cl.
  *H03H 9/72* (2006.01)
  *H03H 9/64* (2006.01)
  *H03H 9/00* (2006.01)

(52) U.S. Cl.
  CPC .......... *H03H 9/725* (2013.01); *H03H 9/6433* (2013.01); *H03H 9/6479* (2013.01); *H03H 9/6483* (2013.01); *H03H 9/0009* (2013.01)

(58) Field of Classification Search
  CPC ...... H03H 9/0009; H03H 9/0028; H03H 9/46; H03H 9/54; H03H 9/542; H03H 9/64;
  (Continued)

(56) References Cited

U.S. PATENT DOCUMENTS

2004/0080384 A1    4/2004   Takeda
2007/0268092 A1    11/2007  Inoue et al.
(Continued)

FOREIGN PATENT DOCUMENTS

JP    2004-96250 A    3/2004
JP    2007-258832 A   10/2007
(Continued)

OTHER PUBLICATIONS

Official Communication issued in International Application PCT/JP2014/067179, dated Sep. 9, 2014.

*Primary Examiner* — Barbara Summons
(74) *Attorney, Agent, or Firm* — Keating & Bennett, LLP

(57) ABSTRACT

A duplexer includes a transmission filter with a ladder circuit configuration and a reception filter. The reception filter includes a series trap element connected to an antenna terminal and a longitudinally coupled resonator-type surface acoustic wave filter. In the transmission filter, a coupling capacitance is connected between an end portion at parallel arm resonators side of an inductance and a line connecting the series trap element to the longitudinally coupled resonator-type surface acoustic wave filter in the reception filter.

19 Claims, 11 Drawing Sheets

(58) Field of Classification Search
CPC .. H03H 9/6433; H03H 9/6436; H03H 9/6479; H03H 9/6483; H03H 9/70; H03H 9/706; H03H 9/725
USPC .......................................................... 333/133
See application file for complete search history.

(56) References Cited

U.S. PATENT DOCUMENTS

| | | | | |
|---|---|---|---|---|
| 2008/0007370 | A1* | 1/2008 | Matsumoto | H03H 9/0061 333/194 |
| 2010/0225418 | A1 | 9/2010 | Kawamoto et al. | |
| 2010/0244979 | A1* | 9/2010 | Matsuda | H03H 9/0571 333/100 |
| 2011/0018654 | A1* | 1/2011 | Bradley | H03H 9/706 333/133 |
| 2013/0307639 | A1 | 11/2013 | Mori | |
| 2014/0010122 | A1* | 1/2014 | Krems | H03H 9/6483 370/277 |
| 2016/0173062 | A1* | 6/2016 | Takamine | H03H 9/6433 333/133 |

FOREIGN PATENT DOCUMENTS

| | | | |
|---|---|---|---|
| JP | 2007-312324 | A | 11/2007 |
| JP | 2010-192974 | A * | 9/2010 |
| JP | 2010-239612 | A | 10/2010 |
| WO | 2012063517 | A1 | 5/2012 |
| WO | 2012/105337 | A1 | 8/2012 |

* cited by examiner

DUPLEXER WITH A SERIES TRAP ELEMENT AND A SPECIFICALLY CONNECTED CAPACITANCE OR ELASTIC WAVE RESONATOR

BACKGROUND OF THE INVENTION

1. Field of the Invention

The present invention relates to duplexers used for, for example, mobile communication terminals. More particularly, the present invention relates to a duplexer including a transmission filter with a ladder circuit configuration that includes multiple elastic wave resonators.

2. Description of the Related Art

Duplexers using surface acoustic wave filters have hitherto been widely used in, for example, mobile communication terminals. For example, Japanese Unexamined Patent Application Publication No. 2004-96250 discloses a surface acoustic wave filter having a ladder circuit configuration as a transmission filter of a duplexer. In Japanese Unexamined Patent Application Publication No. 2004-96250, an antenna terminal, a transmission terminal, and a ground terminal are provided on a piezoelectric substrate. The transmission filter having the ladder circuit configuration is provided between the antenna terminal, the transmission terminal, and the ground terminal. In the ladder circuit configuration, a wiring line connected to the ground terminal is arranged near the antenna terminal between the ground terminal and the antenna terminal to form a coupling capacitance Cg. The attenuation near a high-frequency side of a pass band is supposed to be increased due to the presence of the coupling capacitance Cg.

The provision of the coupling capacitance in the manner described in Japanese Unexamined Patent Application Publication No. 2004-96250 allows the attenuation near the high-frequency side of the pass band of the transmission filter to be increased.

Filter apparatuses in which longitudinally coupled resonator-type elastic wave filters are connected to the antenna terminals via one-port elastic wave resonators have been widely used as reception filters of the duplexers. The provision of the coupling capacitance described in Japanese Unexamined Patent Application Publication No. 2004-96250 in the transmission filter causes a problem in that isolation characteristics in the pass band of the transmission filter are deteriorated. The provision of the coupling capacitance described in Japanese Unexamined Patent Application Publication No. 2004-96250 in the transmission filter also causes a problem in that the attenuation outside the pass band of the reception filter is not sufficiently increased.

SUMMARY OF THE INVENTION

Preferred embodiments of the present invention provide a duplexer that is capable of improving isolation characteristics in a pass band of a transmission filter and that is capable of sufficiently increasing out-of-band attenuation near a pass band of a reception filter.

According to a preferred embodiment of the present invention, a duplexer includes an antenna terminal, a transmission terminal, a reception terminal, a transmission filter and a reception filter. The transmission filter is connected between the antenna terminal and the transmission terminal. The transmission filter has a ladder circuit configuration including multiple elastic wave resonators.

The reception filter is connected between the antenna terminal and the reception terminal. The reception filter includes a band-pass filter unit, which is a longitudinally coupled resonator-type filter portion, and a series trap element connected at the antenna terminal side of the band-pass filter unit.

In a preferred embodiment of the present invention, the transmission filter includes a serial arm resonator, a parallel arm resonator, and an inductor connected between the parallel arm resonator and ground potential. In a preferred embodiment of the present invention, the duplexer further includes a coupling capacitance or an elastic wave resonator. The coupling capacitance or the elastic wave resonator is connected between a line that connects an end portion at the band-pass filter unit side of the series trap element to the band-pass filter unit and an end portion at the parallel arm resonator side of the inductor.

In another specific aspect of a duplexer according to a preferred embodiment of the present invention, the duplexer further includes a piezoelectric substrate. The transmission filter including the ladder circuit configuration, the reception filter, and the coupling capacitance or the elastic wave resonator are provided on the piezoelectric substrate.

In another specific aspect of a duplexer according to a preferred embodiment of the present invention, the transmission filter includes multiple parallel arm resonators and multiple inductors. The coupling capacitance is connected between the inductor closest to the antenna terminal side, among the multiple inductors, and the line.

In another specific aspect of a duplexer according to a preferred embodiment of the present invention, the series trap element includes an elastic wave resonator.

In another specific aspect of a duplexer according to a preferred embodiment of the present invention, the coupling capacitance includes a capacitor element provided on the piezoelectric substrate.

In another specific aspect of a duplexer according to a preferred embodiment of the present invention, the capacitor element includes a pair of comb electrodes provided on the piezoelectric substrate.

According to a duplexer according to a preferred embodiment of the present invention, since the coupling capacitance or the elastic wave resonator is connected in the above manner, it is possible not only to increase the attenuation near the high frequency side of the pass band of the transmission filter but also to improve the isolation characteristics in the pass band of the transmission filter and increase the attenuation outside the pass band of the reception filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will herein be described with reference to the attached drawings to illustrate the present invention.

Figure 1:
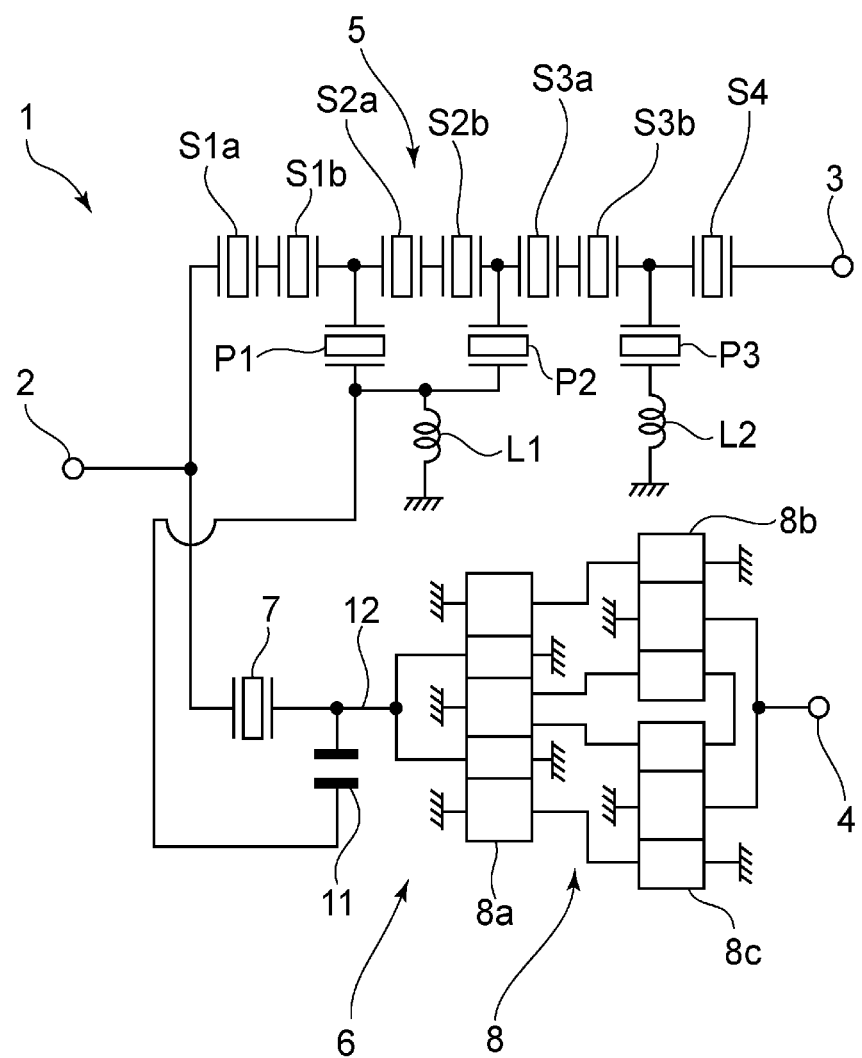
FIG. 1 is a circuit diagram of a duplexer according to a first preferred embodiment of the present invention.
Figure 2:
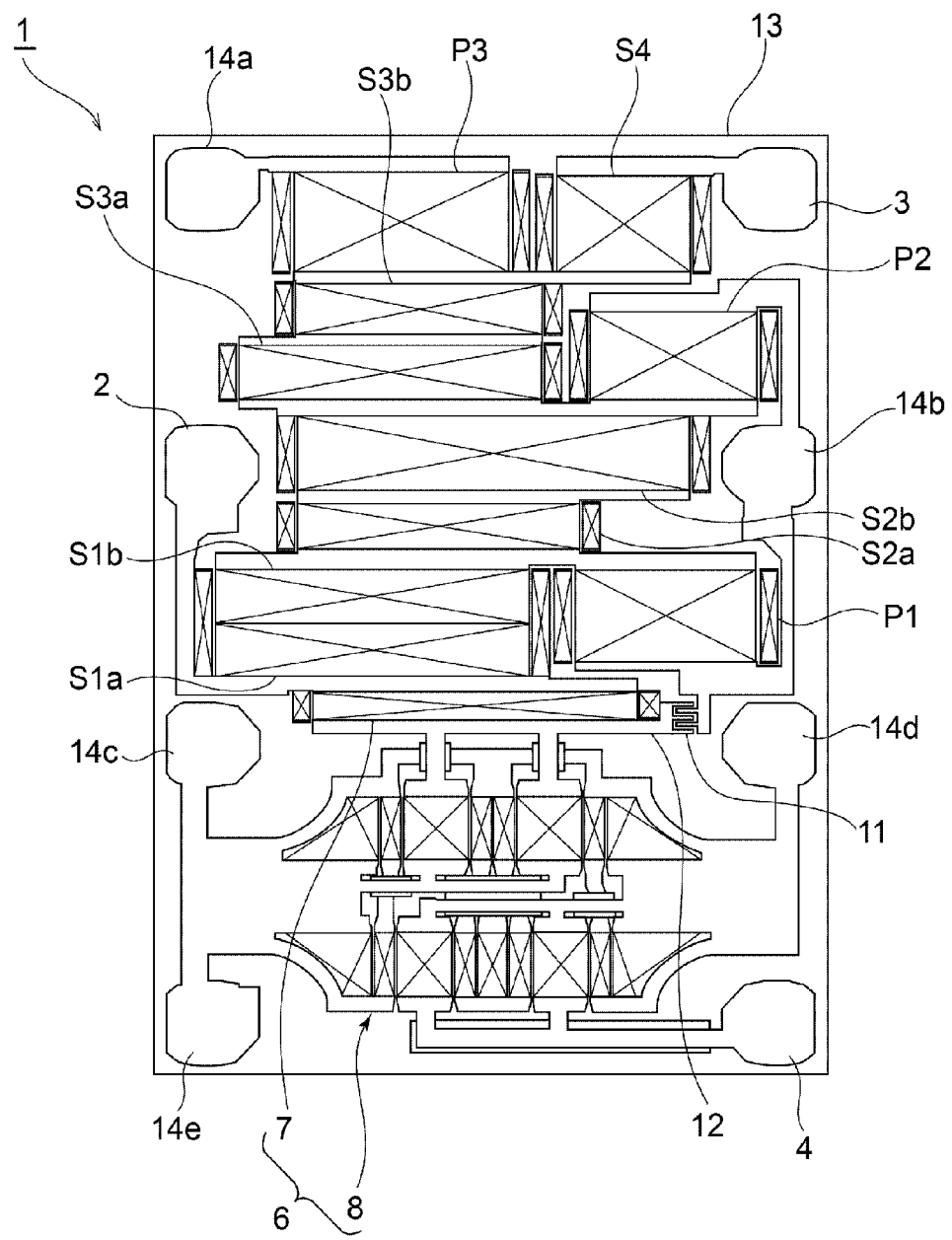
FIG. 2 is a schematic plan view of the duplexer of the first preferred embodiment of the present invention.

FIG. 1 is a circuit diagram of a duplexer according to a first preferred embodiment of the present invention. FIG. 2 is a schematic plan view of the duplexer of the present preferred embodiment.

A duplexer 1 includes an antenna terminal 2, a transmission terminal 3, and a reception terminal 4. A transmission filter 5 is connected between the antenna terminal and the transmission terminal 3. The transmission filter 5 includes a ladder filter. Specifically, the transmission filter includes multiple serial arm resonators S1a, S1b to S4. Specifically, the multiple serial arm resonators S1a, S1b to S4 are connected in series to each other in a serial arm connecting the antenna terminal 2 to the transmission terminal 3. First to third parallel arms are connected between the serial arm and ground potential.

The first parallel arm includes a parallel arm resonator P1. One end of the parallel arm resonator P1 is connected to a node between the serial arm resonator S1b and the serial arm resonator S2a and the other end of the parallel arm resonator P1 is connected to the ground potential via an inductance L1. The second parallel arm includes a parallel arm resonator P2. One end of the parallel arm resonator P2 is connected to a node between the serial arm resonator S2b and the serial arm resonator S3a. The other end of the parallel arm resonator P2 is connected to the ground potential via the inductance L1. In other words, the parallel arm resonator P1 and the parallel arm resonator P2 are commonly connected to the inductance L1. The third parallel arm includes a parallel arm resonator P3. One end of the parallel arm resonator P3 is connected to a node between the serial arm resonator S3b and the serial arm resonator S4. The other end of the parallel arm resonator P3 is connected to the ground potential via an inductance L2.

A reception filter 6 is connected between the antenna terminal 2 and the reception terminal 4. The reception filter 6 includes a series trap element 7 including a surface acoustic wave resonator and a longitudinally coupled resonator-type surface acoustic wave filter 8. One end of the series trap element 7 is connected to the antenna terminal 2 and the other end of the series trap element 7 is connected to the longitudinally coupled resonator-type surface acoustic wave filter 8. The longitudinally coupled resonator-type surface acoustic wave filter 8 includes a band-pass filter unit according to a preferred embodiment of the present invention. In the longitudinally coupled resonator-type surface acoustic wave filter 8, second and third longitudinally coupled resonator-type surface acoustic wave filter portions 8b and 8c are connected to a first longitudinally coupled resonator-type surface acoustic wave filter portion 8a. Although the longitudinally coupled resonator-type surface acoustic wave filter 8 is an unbalanced filter apparatus, a longitudinally coupled resonator-type elastic wave filter having a balanced-unbalanced transforming function may be used as the longitudinally coupled resonator-type surface acoustic wave filter 8 in a preferred embodiment of the present invention.

One end of the longitudinally coupled resonator-type surface acoustic wave filter 8 is connected to the series trap element 7 and the other end of the longitudinally coupled resonator-type surface acoustic wave filter 8 is connected to the reception terminal 4.

The duplexer 1 of the present preferred embodiment preferably includes a coupling capacitance 11 illustrated in FIG. 1. The coupling capacitance 11 is connected between a line 12 connecting the series trap element 7 to the longitudinally coupled resonator-type surface acoustic wave filter 8 and an end portion at the parallel arm resonators P1 and P2 side of the inductance L1.

As illustrated in FIG. 2, the duplexer 1 preferably includes a piezoelectric substrate 13. A piezoelectric monocrystal substrate made of, for example, $LiNbO_3$ or $LiTaO_3$ may be used as the piezoelectric substrate 13. The piezoelectric substrate 13 may be made of, for example, piezoelectric ceramics. Alternatively, a substrate may be used as the piezoelectric substrate 13, in which a high-acoustic-velocity film is deposited on a support base, a low-acoustic-velocity film is deposited on the high-acoustic-velocity film, and a piezoelectric film is deposited on the low-acoustic-velocity film. The acoustic velocity of a bulk wave propagating through the high-acoustic-velocity film is higher than that of an elastic wave propagating through the piezoelectric film. The acoustic velocity of the bulk wave propagating through the low-acoustic-velocity film is lower than that of the bulk wave propagating through the piezoelectric film.

The antenna terminal 2, the transmission terminal 3, and the reception terminal 4 include electrode lands provided near a peripheral edge on the piezoelectric substrate 13. In addition, multiple ground terminals 14a to 14e are provided near the peripheral edge on the piezoelectric substrate 13.

The serial arm resonators S1a to S4 and the parallel arm resonators P1 to P3 illustrated in FIG. 1 each include a one-port surface acoustic wave resonator. As is well known in the art, the one-port surface acoustic wave resonator includes an interdigital transducer (IDT) electrode and reflectors arranged on both sides in a direction in which the surface acoustic wave is propagated of the IDT electrode. Symbols each including X surrounded by a rectangular or substantially rectangular frame schematically illustrate the IDT electrodes and the reflectors in FIG. 2.

As illustrated in FIG. 2, the serial arm resonators S1a to S4 and the parallel arm resonators P1 to P3 are connected between the antenna terminal 2, and the transmission terminal 3 and the ground terminals 14a and 14b.

The inductance L1 is connected between the ground terminal 14b and the ground potential. Specifically, the inductance L1 is externally connected in the structure illustrated in FIG. 2. Similarly, the inductance L2 is also externally connected so that one end of the inductance L2 is connected to the ground terminal 14a. The inductances L1 and L2 are capable of being provided by connecting an inductance element to the ground terminals 14b and 14a, respectively, or by connecting a bonding wire including an inductance component to the ground terminals 14b and 14a, respectively.

Also in the reception filter 6, each portion including the IDT electrode and the reflector is schematically illustrated by a graphic in which X is surrounded by a rectangular or substantially rectangular frame.

As illustrated in FIG. 2, the coupling capacitance 11 is provided between the line 12 connecting the series trap element 7 to the longitudinally coupled resonator-type surface acoustic wave filter 8 and the ground terminal 14b.

More specifically, the coupling capacitance 11 of the present preferred embodiment includes a capacitor element including a pair of comb electrodes.

The pair of comb electrodes is capable of being easily provided with a thin-film forming method, like other lines. Accordingly, the coupling capacitance 11 is capable of being easily provided in the present preferred embodiment. In addition, in the capacitor element including the pair of the comb electrodes, differentiating the number of the comb electrodes and the width of electrode fingers allows the electrostatic capacitance of the coupling capacitance to be easily adjusted.

The coupling capacitance 11 is not limited to the pair of comb electrodes in a preferred embodiment of the present invention and may include another capacitor element. In addition, the coupling capacitance 11 is not limited to the capacitor element and may have various structures with which the electrostatic capacitance is produced.

The ground terminal 14b corresponds to a portion connected to the parallel arm resonator P1 and the inductance L1, as described above. Accordingly, the coupling capacitance 11 is connected between the end portion at the parallel arm resonators P1 and P2 side of the inductance L1 and the line 12.

In the pair of comb electrodes providing the coupling capacitance 11, the direction in which the electrode fingers extend is parallel or substantially parallel to the direction in which the surface acoustic wave is propagated on the piezoelectric substrate 13. In other words, the directions in which the electrode fingers of each IDT electrode extend in the serial arm resonators S1a to S4, the parallel arm resonators P1 to P3, the series trap element 7, and the longitudinally coupled resonator-type surface acoustic wave filter 8 are parallel or substantially parallel to each other. The direction in which the electrode fingers extend in the pair of comb electrodes is perpendicular or substantially perpendicular to the direction in which the electrode fingers extend in the IDT electrodes.

Although not specifically limited, the direction in which the electrode fingers of the comb electrodes extend is preferably different from the direction in which the electrode fingers of the IDT electrodes extend, as described above. The direction in which the electrode fingers of the comb electrodes extend is more preferably shifted from the direction in which the electrode fingers of the IDT electrodes extend by 90 degrees, as in the present preferred embodiment. This causes the duplexer 1 to be less affected by the surface acoustic wave excited by the pair of comb electrodes.

Since the coupling capacitance 11 is configured in the above manner in the duplexer 1 of the present preferred embodiment, it is possible to improve the isolation characteristics in the transmission band and to sufficiently increase the attenuation near the pass band of the reception filter. This will now be described using a specific example.

A non-limiting example of the duplexer 1 was manufactured in accordance with the following specifications.
Piezoelectric substrate 13: LiTaO$_3$ substrate
Specifications of serial arm resonators S1a, S1b to S4 and parallel arm resonators P1 to P3

TABLE 1

|  |  | S1a and S1b | P1 | S2a | S2b | P2 | S3a | S3b | P3 | S4 |
|---|---|---|---|---|---|---|---|---|---|---|
| Wavelength of IDT | (μm) | 4.2785 | 4.4844 | 4.2373 | 4.3164 | 4.4646 | 4.3363 | 4.2334 | 4.4744 | 4.2785 |
| Wavelength of reflector | (μm) | Same as that of IDT | Same as that of IDT | Same as that of IDT | Same as that of IDT | Same as that of IDT | Same as that of IDT | Same as that of IDT | Same as that of IDT | Same as that of IDT |
| Intersecting width | (μm) | 136.19 | 149.09 | 65.45 | 73.68 | 129.12 | 105.27 | 60.47 | 137.85 | 70.18 |
| Number of pairs of electrode fingers of IDT |  | 50 | 77 | 93 | 111.5 | 59.5 | 145 | 107 | 65 | 118.5 |
| Number of electrode fingers of reflector |  | 15 | 15 | 15 | 15 | 15 | 15 | 15 | 15 | 15 |
| Duty |  | 0.55 | 0.55 | 0.55 | 0.55 | 0.55 | 0.55 | 0.55 | 0.55 | 0.55 |

An inductance element of 1.0 nH was connected as the inductance L1 and an inductance element of 0.7 nH was connected as the inductance L2.

Series trap element 7: A one-port surface acoustic wave resonator having the specifications illustrated in Table 2 was configured.

TABLE 2

| Wavelength of IDT | (μm) | 3.997 |
|---|---|---|
| Wavelength of reflector | (μm) | Same as that of IDT |
| Intersecting width | (μm) | 37 |
| Number of pairs of electrode fingers of IDT |  | 130 |
| Number of electrode fingers of reflector |  | 18 |
| Duty |  | 0.5 |

A detailed description of longitudinally coupled resonator-type surface acoustic wave filter 8 follows.

The second and third longitudinally coupled resonator-type surface acoustic wave filter portions were connected to the 5IDT-type first longitudinally coupled resonator-type surface acoustic wave filter portion, as illustrated in FIG. 1. The respective surface acoustic wave filter portions have the following specifications.

The first longitudinally coupled resonator-type surface acoustic wave filter portion was a 5-IDT type and had the electrode fingers arranged with an intersecting width of 88 μm. The third longitudinally coupled resonator-type surface acousticwave filter portion was 3-IDT type and had the electrode fingers arranged with an intersecting width of 88 μm. The wavelengths of the first to fifth IDTs and the wavelength of the reflectors in the first longitudinally coupled resonator-type surface acoustic wave filter portion are illustrated in Table 3:

TABLE 3

|  | Wavelength (μm) |
| --- | --- |
| Reflector | 4.195 |
| Middle portions of first and fifth IDTs | 4.093 |
| Narrow pitch portions of first and fifth IDTs | 3.955 |
| Narrow pitch portions of second and fourth IDTs (outside) | 3.847 |
| Middle portions of second and fourth IDTs | 4.143 |
| Narrow pitch portions of second and fourth IDTs (inside) | 3.853 |
| Narrow pitch portion of third IDT | 3.952 |
| Middle portion of third IDT | 4.118 |

The wavelengths of the left-side IDT, the right-side IDT, and the middle IDT and the wavelength of the reflectors in the second and third longitudinally coupled resonator-type surface acoustic wave filter portions are illustrated in Table 4:

TABLE 4

|  | Wavelength (μm) |
| --- | --- |
| Reflector | 4.195 |
| Middle portions of left-side and right-side IDTs | 4.107 |
| Narrow pitch portions of left-side and right-side IDTs | 3.971 |
| Narrow pitch portion of middle IDT | 3.79 |
| Middle portion of middle IDT | 4.134 |

The duty of the reflectors in the second and third longitudinally coupled resonator-type surface acoustic wave filter portions was set to 0.63 and the duty in the IDTs was set to 0.68.

The number of pairs of the electrode fingers of the IDTs in the first longitudinally coupled resonator-type surface acoustic wave filter portion was set to the values illustrated in Table 5. The numbers of pairs of the electrode fingers of the IDTs in the second and third longitudinally coupled resonator-type surface acoustic wave filter portions were set to the values illustrated in Table 6.

TABLE 5

|  | Number of pairs |
| --- | --- |
| Middle portions of first and fifth IDTs | 6.5 |
| Narrow pitch portions of first and fifth IDTs | 2 |
| Narrow pitch portions of second and fourth IDTs (outside) | 3 |
| Middle portions of second and fourth IDTs | 21.5 |
| Narrow pitch portions of second and fourth IDTs (inside) | 3 |
| Narrow pitch portion of third IDT | 2 |
| Middle portion of third IDT | 12.5 |

TABLE 6

|  | Number of pairs |
| --- | --- |
| Middle portions of left-side and right-side IDTs | 6 |
| Narrow pitch portions of left-side and right-side IDTs | 2 |
| Narrow pitch portion of middle IDT | 2 |
| Middle portion of middle IDT | 17.5 |

The number of the electrode fingers of each reflector in the second and third longitudinally coupled resonator-type surface acoustic wave filter portions was set to 75.

A pair of comb electrodes having an electrostatic capacitance of 0.25 pF was formed as the coupling capacitance 11. The electrode film was made of Al.

Figure 6:
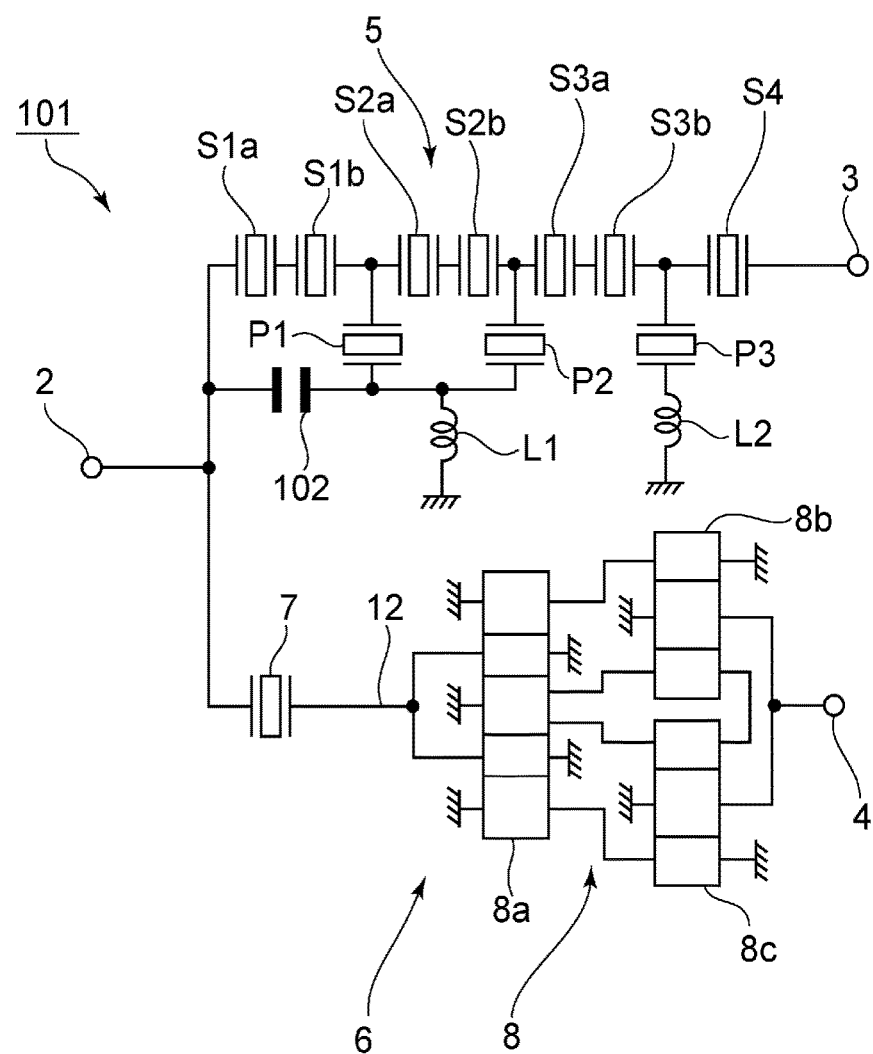
FIG. 6 is a circuit diagram of a duplexer of the first comparative example.
Figure 7:
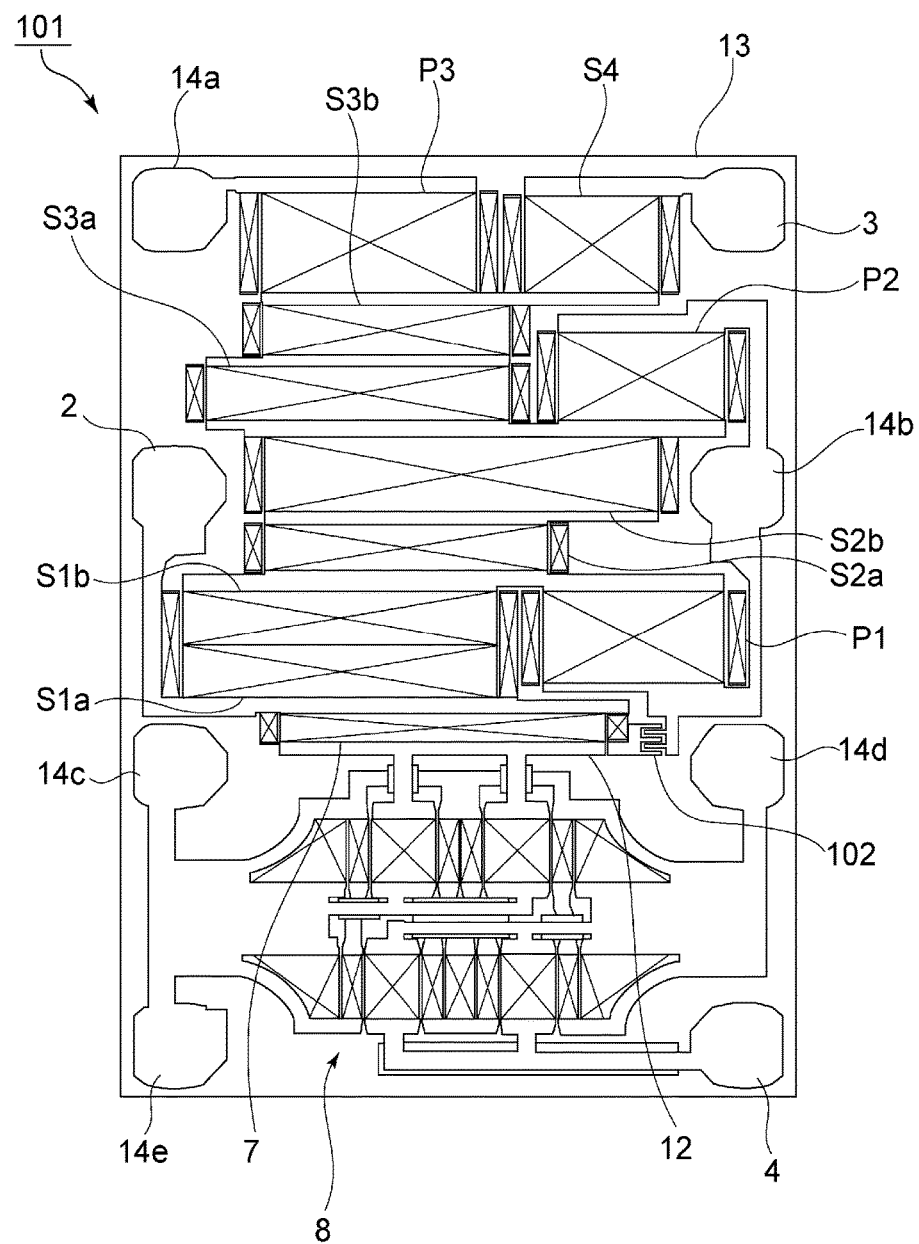
FIG. 7 is a schematic plan view of the duplexer of the first comparative example.

For comparison, instead of the coupling capacitance 11 described above, a duplexer 101 of a first comparative example having a coupling capacitance 102 illustrated in FIG. 6 and FIG. 7 was formed. Specifically, the coupling capacitance 102 including a pair of comb electrodes of 0.25 pF was provided in the same manner as in the above example. One end of the coupling capacitance 102 was connected to the antenna terminal and the other end of the coupling capacitance 102 was connected to the end portion at the parallel arm resonators P1 and P2 side of the inductance L1. The remaining configuration is the same as that of the example of the above preferred embodiment.

Figure 3:
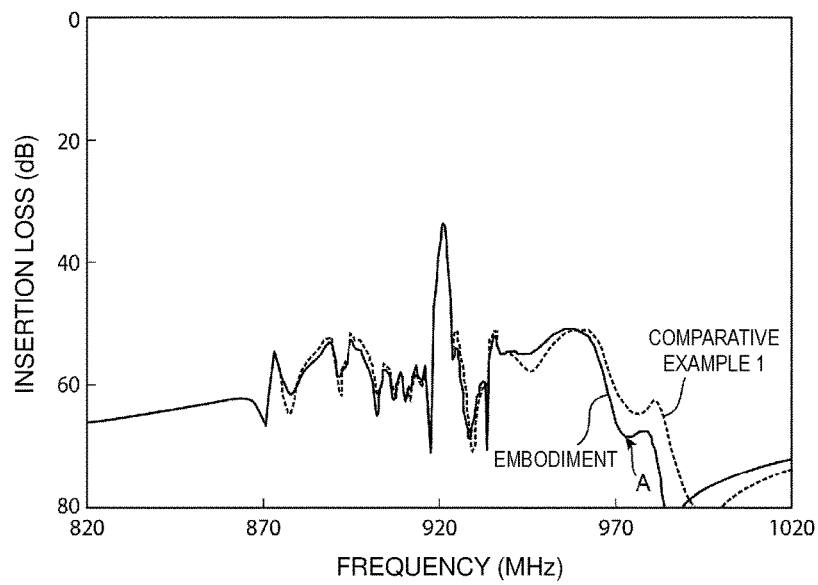
FIG. 3 is a graph illustrating isolation characteristics of an example of the first preferred embodiment and a first comparative example.
Figure 4:
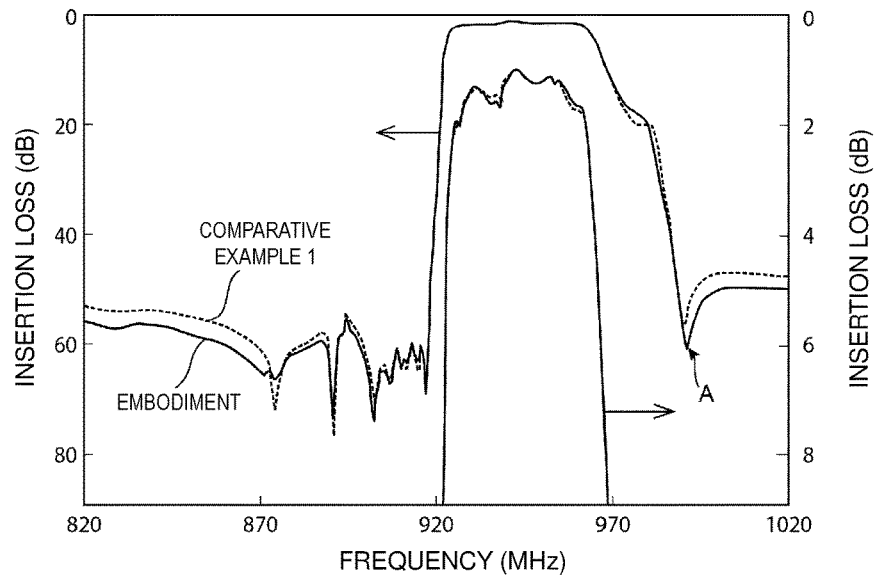
FIG. 4 is a graph illustrating attenuation-frequency characteristics of reception filters of the example of the first preferred embodiment and the first comparative example.
Figure 5:
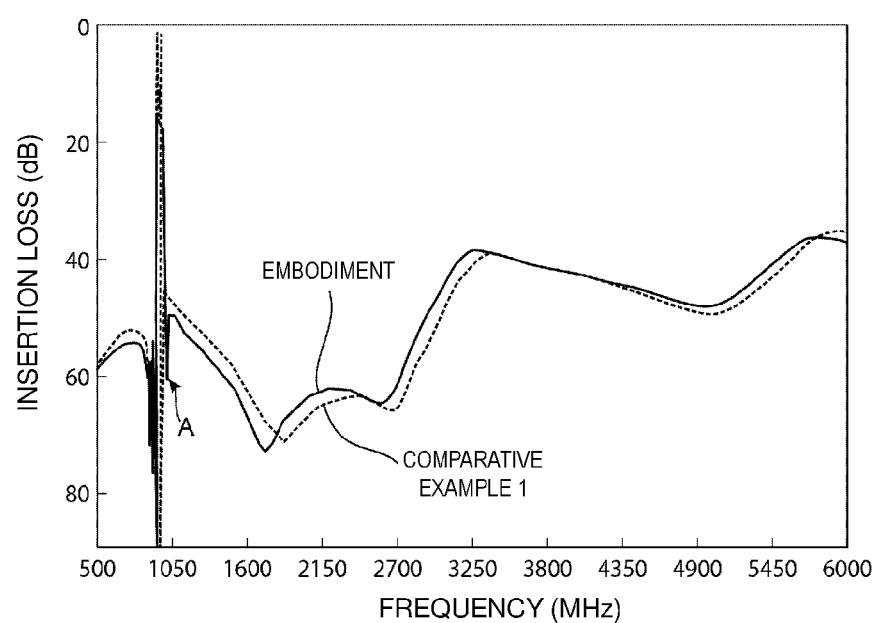
FIG. 5 is a graph illustrating attenuation-frequency characteristics of the reception filters of the example of the first preferred embodiment and the first comparative example.

The isolation characteristics of the duplexers of the example of the above preferred embodiment and the first comparative example, which were prepared in the above manner, are illustrated in FIG. 3. FIG. 4 and FIG. 5 illustrate attenuation-frequency characteristics of the reception filters in the duplexers of the example of the above preferred embodiment and the first comparative example.

The Band8 duplexer is provided as an example of the above preferred embodiment. Accordingly, the pass band of the transmission filter is about 880 MHz to about 915 MHz and the pass band of the reception filter is about 925 MHz to about 960 MHz.

As apparent from FIG. 3, the isolation characteristics of the example of the above preferred embodiment are similar to the isolation characteristics of the first comparative example in the pass band of the reception filter. However, the isolation characteristics in the transmission band in the example of the above preferred embodiment are greatly improved, compared with those in the first comparative example.

As illustrated by an arrow A in FIG. 4 and FIG. 5, the attenuation in the attenuation band near the pass band of the reception filter in the example of the above preferred embodiment is greatly improved, compared with that in the comparative example. In other words, the duplexer in the example of the above preferred embodiment not only achieves an effect of improving the attenuation at the high-frequency side near the pass band in the transmission band due to the coupling capacitance described in Japanese Unexamined Patent Application Publication No. 2004-96250 but also greatly improves the isolation characteristics in the transmission band and improves the attenuation near the pass band of the reception filter. It is supposed that the reason for this is as described below.

Figure 8:
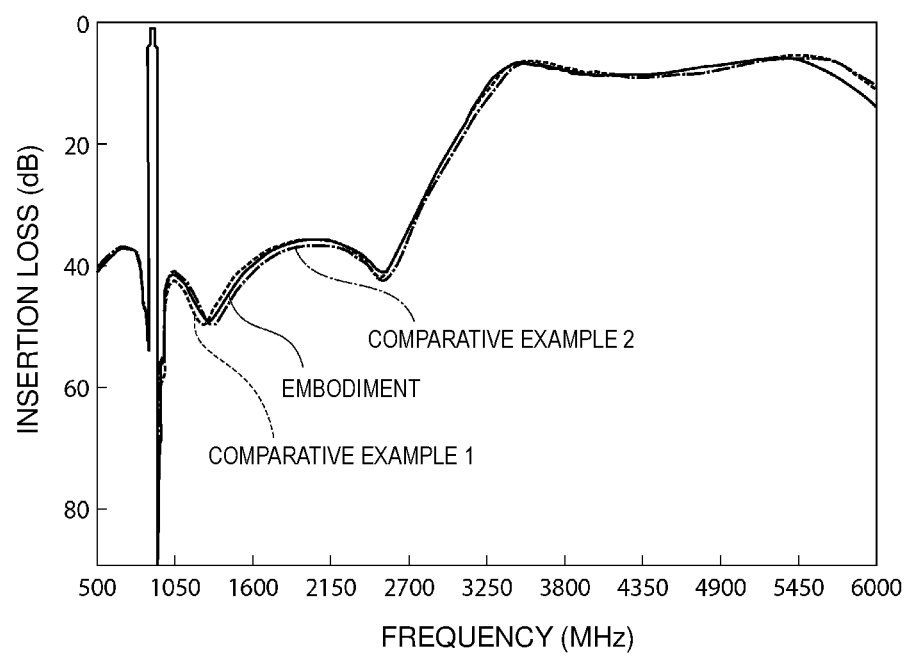
FIG. 8 is a graph illustrating filter characteristics of transmission filters in the duplexers of the example of the first preferred embodiment, the first comparative example, and a second comparative example.

FIG. 8 illustrates the characteristics of the transmission filters in the duplexers of the example of the above preferred embodiment and the first comparative example and the filter characteristics of a transmission filter in a duplexer of a second comparative example having the same configuration as that of the example of the above preferred embodiment except that the coupling capacitance 11 is not connected.

FIG. 8 indicates that the connection of the coupling capacitance causes the attenuation pole caused by the parallel arm resonators and the inductance L1 to be shifted toward the low frequency side in the example of the above preferred embodiment and the first comparative example. When the coupling capacitance 11 is connected, a signal is transmitted through the coupling capacitance 11. Accordingly, the shift of the attenuation pole of the transmission filter interacts with the characteristics of the reception filter. It is supposed that the interaction improves the isolation characteristics in the transmission band and increases the attenuation outside the pass band of the reception filter.

As described above, the isolation in the transmission band is greatly improved and the attenuation near the pass band of the reception filter is also greatly increased in the example of the above preferred embodiment, compared with the first comparative example. In other words, the advantages of preferred embodiments of the present invention are achieved by connecting the coupling capacitance 11 between the end portion at the parallel arm resonators P1 and P2 side of the inductance L1 and the line 12 connecting the series trap element 7 to the longitudinally coupled resonator-type surface acoustic wave filter 8.

Figure 9:
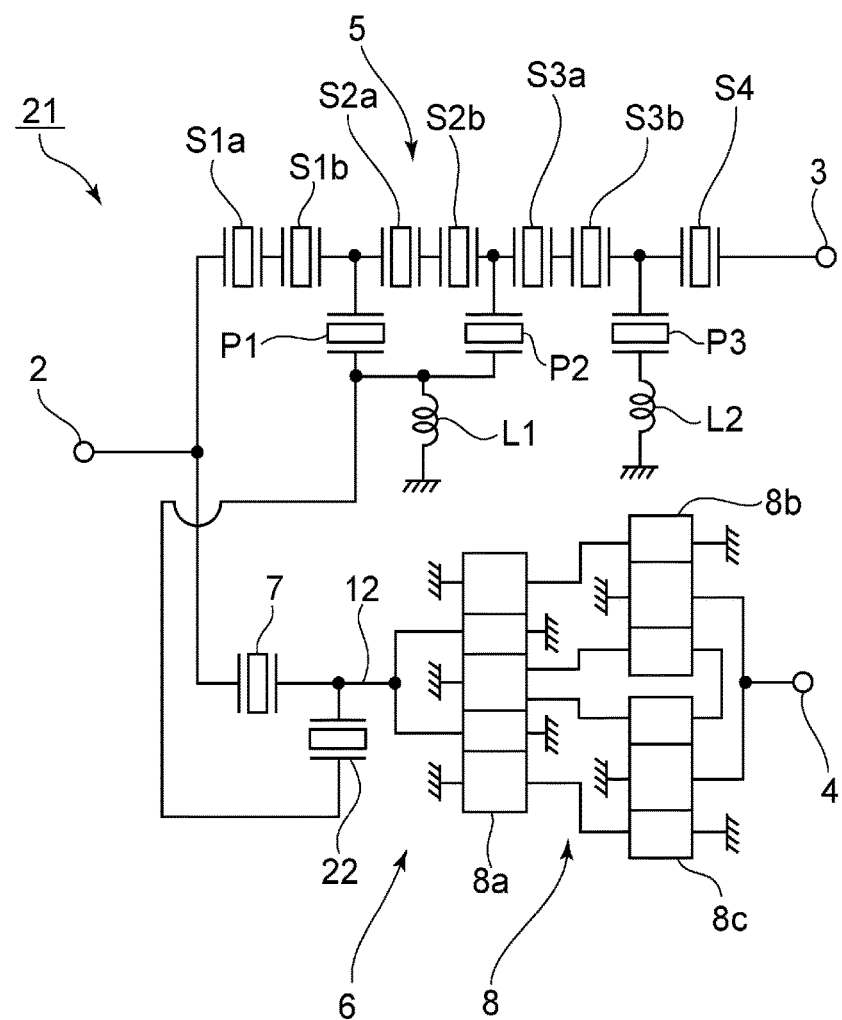
FIG. 9 is a circuit diagram of a duplexer according to a second preferred embodiment of the present invention.

FIG. 9 is a circuit diagram of a duplexer 21 according to a second preferred embodiment of the present invention.

The duplexer 21 of the second preferred embodiment includes an elastic wave resonator 22, instead of the coupling capacitance 11. Although the elastic wave resonator 22 includes a one-port surface acoustic wave resonator, the elastic wave resonator 22 may include a boundary acoustic wave resonator. The remaining configuration of the second preferred embodiment is the same as that of the first preferred embodiment. Accordingly, the same reference numerals are used in the second preferred embodiment to identify the same components illustrated in the first preferred embodiment. A description of such components is omitted herein.

As in the present preferred embodiment, instead of the coupling capacitance 11, the elastic wave resonator 22 may be connected between the end portion at the parallel arm resonators P1 and P2 side of the inductance L1 and the line 12. Also in this case, the isolation in the transmission band is improved and the attenuation at the pass band side of the reception filter is increased, as in the first preferred embodiment, as long as the elastic wave resonator 22 is connected so as to provide a capacitance. In addition, the attenuation at the high-frequency side in the transmission band is also increased.

Figure 10:
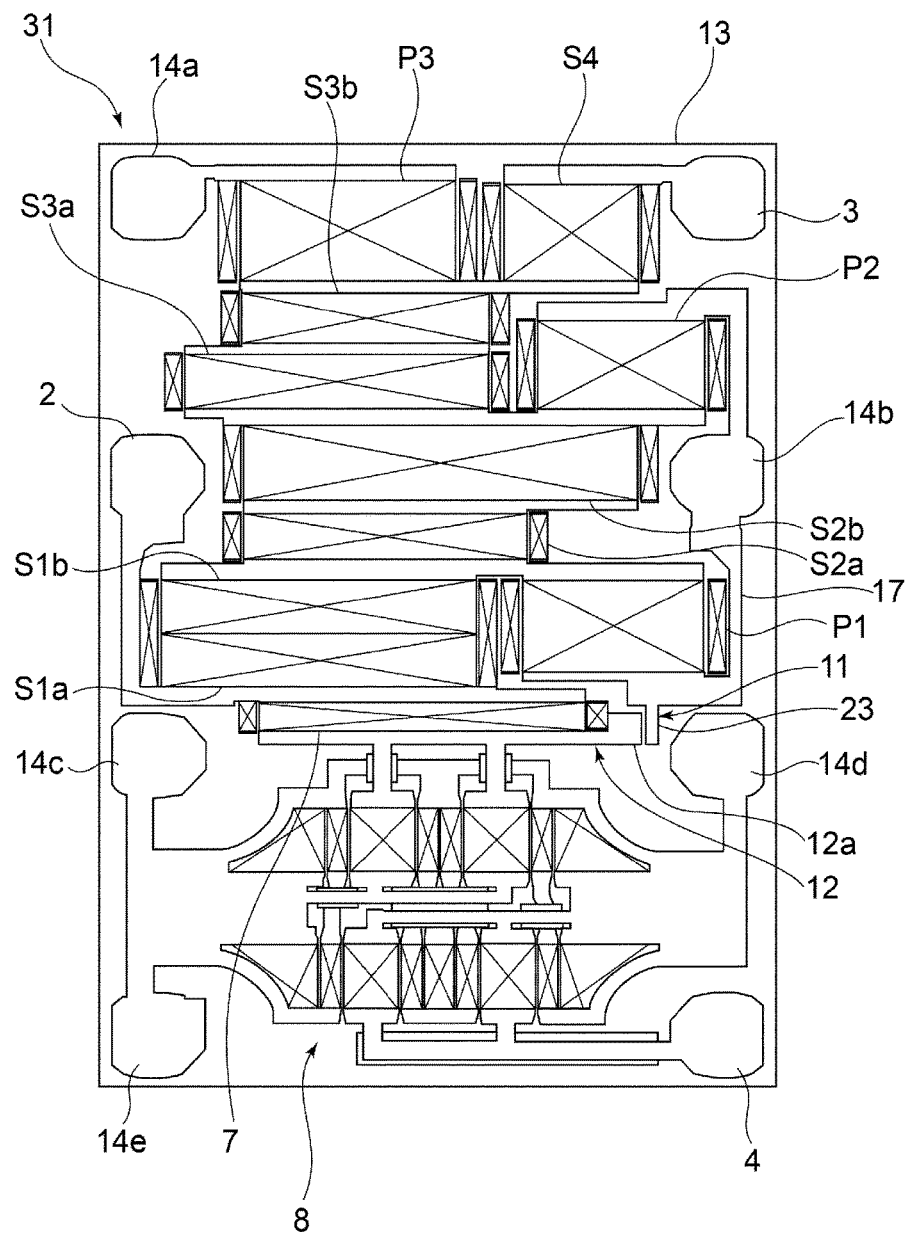
FIG. 10 is a schematic plan view of a first modification of the duplexer according to the first preferred embodiment.

FIG. 10 is a schematic plan view of a duplexer 31 according to a first modification of the first preferred embodiment of the present invention. In the present modification, the coupling capacitance 11 includes a capacitance generating electrode portion 12a connected to the line 12 and a capacitance generating electrode portion 23 opposing the capacitance generating electrode portion 12a across a gap, instead of the pair of comb electrodes. The capacitance generating electrode portion 23 is connected to a line 17 connected to the ground terminal 14b. The coupling capacitance 11 may include electrode patterns opposing to each other across the gap, instead of the pair of comb electrodes, in the above manner. When the electrostatic capacitance is small, the coupling capacitance 11 may include the capacitance generating electrode portions 12a and 23.

Figure 11:
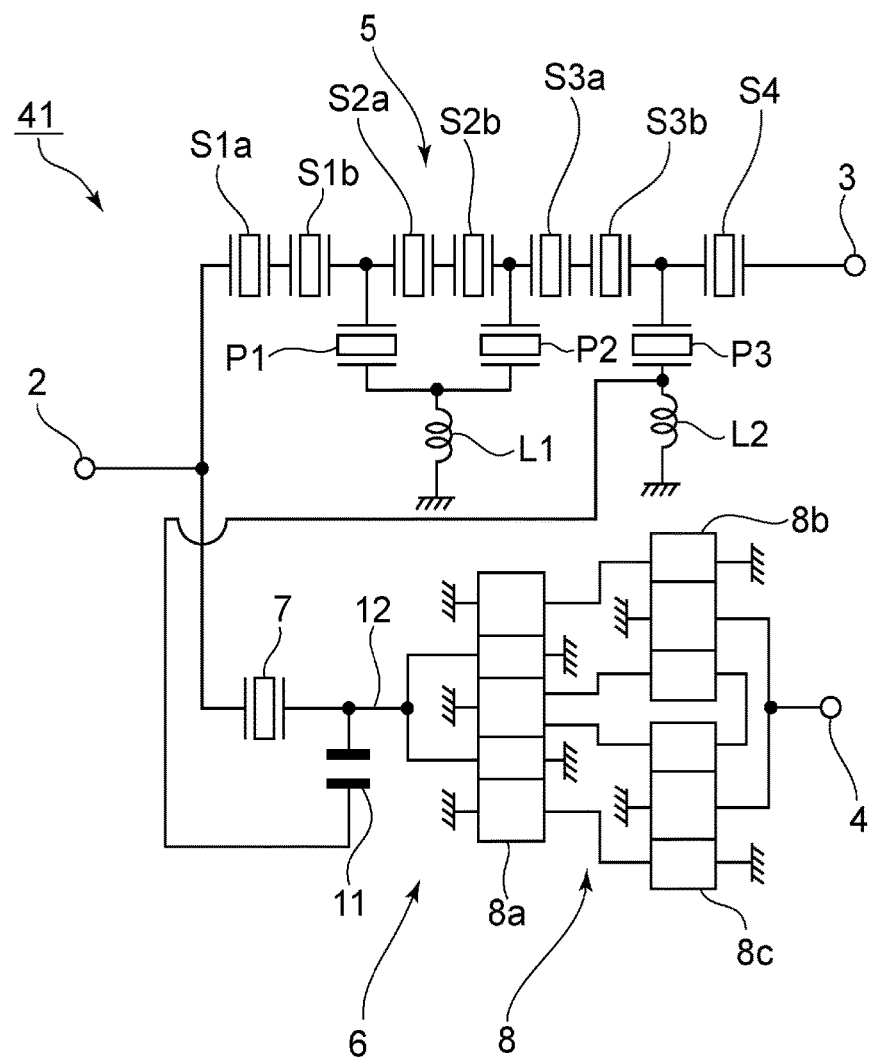
FIG. 11 is a circuit diagram of a second modification of the duplexer according to the first preferred embodiment.

FIG. 11 is a circuit diagram illustrating a second modification of the first preferred embodiment. In a duplexer 41 of the present modification, the coupling capacitance 11 is connected between an end portion at the parallel arm resonator P3 side of the inductance L2, instead of the inductance L1, and the line 12. The coupling capacitance 11 may be connected to the end portion at the parallel arm resonator P3 side of the inductance L2, instead of the inductance L1, in the above manner. In other words, the inductance of the end portion to which the coupling capacitance is connected is not specifically limited as long as the inductance is connected between the parallel arm resonator and the ground potential.

The coupling capacitance 11 is preferably connected to the inductance L1 closest to the antenna terminal. This allows the isolation characteristics to be further improved.

Figure 12:
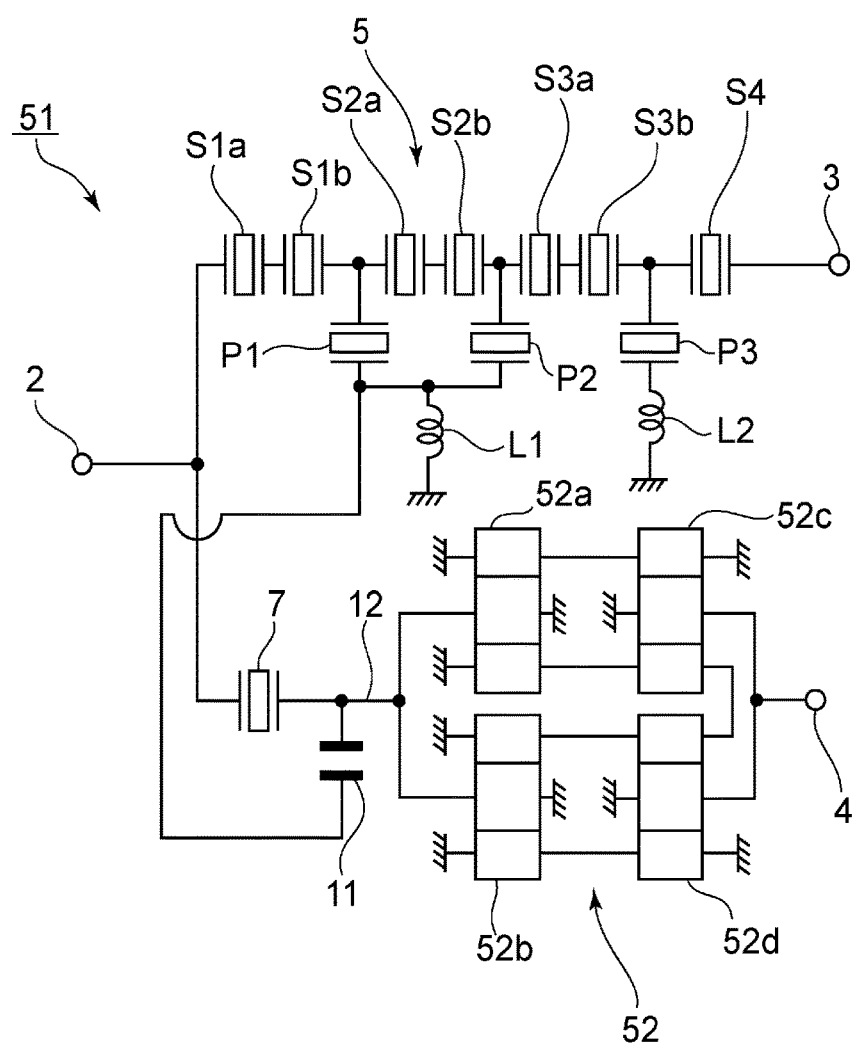
FIG. 12 is a circuit diagram of a third modification of the duplexer according to the first preferred embodiment.

FIG. 12 is a circuit diagram illustrating a third modification of the duplexer of the first preferred embodiment. In a duplexer 51 of the present modification, a longitudinally coupled resonator-type surface acoustic wave filter 52 including first to fourth longitudinally coupled resonator-type surface acoustic wave filter portions 52a to 52d is included, instead of the longitudinally coupled resonator-type surface acoustic wave filter 8. Each of the longitudinally coupled resonator-type surface acoustic wave filter portions 52a to 52d preferably is a 3-IDT-type longitudinally coupled resonator-type surface acoustic filter portion. The longitudinally coupled resonator-type surface acoustic wave filter portion is not specifically limited as long as the longitudinally coupled resonator-type surface acoustic wave filter portion has a configuration in which two or more IDTs sandwiched between two reflectors are arranged in the direction in which the surface acoustic wave is propagated. For example, the longitudinally coupled resonator-type surface acoustic wave filter portion may be a longitudinally coupled resonator-type surface acoustic wave filter portion including five IDTs.

As described above, the configuration of the longitudinally coupled resonator-type surface acoustic wave filter portions of the reception filter is not specifically limited. As described above, the reception filter may include a longitudinally coupled resonator-type elastic wave filter having the balanced-unbalanced transforming function. In this case, first and second balanced terminals define the reception terminals.

In addition, the configuration of the ladder filter of the transmission filter in the duplexer of the present invention is not limited to the configurations of the preferred embodiments and the modifications described above. Specifically, a ladder filter including an arbitrary number of stages may be used. However, it is preferable to use the ladder filter having the configuration in which an inductance is connected between the parallel arm resonator and the ground potential. The coupling capacitance or the elastic wave resonator should be connected between one end of the inductance and the line 12.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A duplexer comprising:
an antenna terminal;
a transmission terminal;
a reception terminal;
a transmission filter that is connected between the antenna terminal and the transmission terminal and that has a ladder circuit configuration including a plurality of elastic wave resonators; and
a reception filter that is connected between the antenna terminal and the reception terminal and that includes a band-pass filter unit, which is a longitudinally coupled resonator filter portion, and a series trap element connected at an antenna terminal side of the band-pass filter unit; wherein the transmission filter includes a serial arm resonator, a parallel arm resonator, and an inductor connected between the parallel arm resonator and a ground potential; wherein a coupling capacitance or an elastic wave resonator is connected between a line that connects an end portion at a band-pass filter unit side of the series trap element to the band-pass filter unit and an end portion at a parallel arm resonator side of the inductor.

2. The duplexer according to claim 1, further comprising:
a piezoelectric substrate; wherein
the transmission filter, the reception filter, and the coupling capacitance or the elastic wave resonator are provided on the piezoelectric substrate.

3. The duplexer according to claim 2, wherein the coupling capacitance includes a capacitor element provided on the piezoelectric substrate.

4. The duplexer according to claim 3, wherein the capacitor element includes a pair of comb electrodes provided on the piezoelectric substrate.

5. The duplexer according to claim 2, wherein a plurality of ground terminals are provided near a peripheral edge on the piezoelectric substrate.

6. The duplexer according to claim 2, wherein the coupling capacitance includes a capacitor element including a pair of comb electrodes provided on the piezoelectric substrate.

7. The duplexer according to claim 6, wherein in the pair of comb electrodes of the coupling capacitance, a direction in which electrode fingers extend is parallel or substantially parallel to a direction in which a surface acoustic wave is propagated on the piezoelectric substrate.

8. The duplexer according to claim 7, wherein the direction in which the electrode fingers of the pair of comb electrodes extend is perpendicular or substantially perpendicular to the direction in which electrode fingers of each IDT electrode extend in the serial arm resonator, the parallel arm resonator, the series trap element, and the longitudinally coupled resonator filter portion.

9. The duplexer according to claim 7, wherein the direction in which the electrode fingers of the pair of comb electrodes extend is shifted from a direction in which electrode fingers of each IDT electrode extend in the serial arm resonator, the parallel arm resonator, the series trap element, and the longitudinally coupled resonator filter portion by 90 degrees.

10. The duplexer according to claim 1, wherein the transmission filter includes a plurality of parallel arm resonators and a plurality of inductors and the coupling capacitance is connected between the inductor closest to the antenna terminal side, among the plurality of inductors, and the line.

11. The duplexer according to claim 1, wherein the series trap element includes an elastic wave resonator.

12. The duplexer according to claim 1, wherein the serial arm resonator includes a plurality of serial arm resonators connected in series to each other to define a serial arm connecting the antenna terminal to the transmission terminal.

13. The duplexer according to claim 12, wherein a plurality of parallel arms are connected between the serial arm and a ground potential.

14. The duplexer according to claim 1, wherein one end of the series trap element is connected to the antenna terminal and the other end of the series trap element is connected to the longitudinally coupled resonator filter portion.

15. The duplexer according to claim 1, wherein the longitudinally coupled resonator filter portion defines a longitudinally coupled resonator surface acoustic wave filter.

16. The duplexer according to claim 15, wherein the longitudinally coupled resonator surface acoustic wave filter is one of an unbalanced filter apparatus and a longitudinally coupled resonator elastic wave filter having a balanced-unbalanced transforming function.

17. The duplexer according to claim 1, wherein directions in which electrode fingers of each IDT electrode extend in the serial arm resonator, the parallel arm resonator, the series trap element, and the longitudinally coupled resonator filter portion are parallel or substantially parallel to each other.

18. The duplexer according to claim 1, wherein the elastic wave resonator includes one of a one-port surface acoustic wave resonator and a boundary acoustic wave resonator.

19. The duplexer according to claim 1, wherein the coupling capacitance includes a capacitance generating electrode portion connected to the line and a capacitance generating electrode portion opposing the capacitance generating electrode portion across a gap.

* * * * *